(12) United States Patent
Viola

(10) Patent No.: US 6,570,373 B1
(45) Date of Patent: May 27, 2003

(54) CURRENT SENSOR PROGRAMMABLE THROUGH CONNECTOR

(75) Inventor: Jeffrey Louis Viola, Berkley, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/093,190

(22) Filed: Mar. 7, 2002

(51) Int. Cl.⁷ .................................................. G01R 1/02
(52) U.S. Cl. ..................... 324/130; 324/127; 324/117 H
(58) Field of Search ............................. 324/130, 117 H, 324/117 R, 127; 336/66, 175, 130–234

(56) References Cited

U.S. PATENT DOCUMENTS

| | | | | |
|---|---|---|---|---|
| 4,901,008 A | * | 2/1990 | Quastel et al. | .......... 324/117 H |
| 5,057,769 A | * | 10/1991 | Edwards | ...................... 324/127 |
| 5,146,156 A | * | 9/1992 | Marcel | ................... 324/117 H |
| 5,493,211 A | * | 2/1996 | Baker | .......................... 324/130 |
| 5,923,162 A | | 7/1999 | Drafts et al. | |

\* cited by examiner

*Primary Examiner*—Kamand Cuneo
*Assistant Examiner*—Tung X. Nguyen
(74) *Attorney, Agent, or Firm*—MacMillan, Sobanski & Todd, LLC

(57) ABSTRACT

An apparatus for sensing electrical current flowing in a conductor includes a toroidal core formed of a ferric material and having a slot defining an air gap, a Hall Effect sensor integrated circuit positioned in the air gap for sensing electrical current flowing in a conductor received in a central aperture of the core, and a housing enclosing the core and the integrated circuit. The integrated circuit can be programmed to set functions such as output offset, gain, temperature compensation and a current sensing range.

12 Claims, 2 Drawing Sheets

CURRENT SENSOR PROGRAMMABLE THROUGH CONNECTOR

FIELD OF THE INVENTION

The present invention relates generally to an apparatus for calibrating electric current sensors.

BACKGROUND OF THE INVENTION

Prior art analog based current sensors are designed to operate in a fixed range of current magnitudes. The lack of programmability means that multiple variations of current sensors need to be manufactured to accommodate applications requiring different current sensing ranges. Further, the prior art current sensors set the device gains/offsets by scribing resistive elements before final assembly or adjusting potentiometers. Both of these methods have drawbacks.

SUMMARY OF THE INVENTION

The present invention concerns an apparatus for calibrating sensors of electric current to ease problems brought on by part and process variations which affect sensor performance. The apparatus according to the present invention affords these sensors the flexibility to be calibrated to measure current levels in different working ranges appropriate for given applications. The innovative apparatus incorporates into the design of the sensor a Hall-effect magnetic field transducer element that enables the current measurement response function of the sensor to be programmed via the electrical interface connection of the sensor device. The primary parameters to be set via the connector interface are the transducer gain and offset.

The apparatus for sensing electrical current flowing in a conductor includes a toroidal core formed of a ferric material and having a slot extending through the core defining an air gap, the core having a central aperture, and an electrical current carrying conductor received in said central aperture, said core concentrating in said air gap magnetic flux generated by electrical current flowing in said conductor. A power supply is connected to the conductor for generating a known electrical current in the conductor and a Hall Effect sensor integrated circuit is positioned in the air gap and has a power supply pin and an output pin. A programming means is connected to the power supply pin and the output pin, whereby the integrated circuit responds to an application of a lower voltage first signal applied at the power supply pin by the programming means by generating at the output pin an output signal representing an amount of the known current flowing in the conductor and the integrated circuit responds to a higher voltage second signal applied at the power supply pin by accepting a programming signal applied at the output pin and calibrating the output signal in response to the programming signal.

The benefits of incorporating a sensing element programmable through the connector include: a) the ability to eliminate part-to-part variability and process variation of the end-of-line packaged units; and b) programmability allows the setting of both gain and offset after complete assembly thus permitting a single hardware implementation to meet the working electrical current ranges for different applications. The programmability enables the manufacturer to reduce the number of versions of parts needed to accommodate customer applications, thereby reducing costs.

Incorporation of the means to program the electric current sensor through the external electrical connector after final assembly bypasses the problems associated with the prior art current sensors in an economical and easily manufacturable way.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
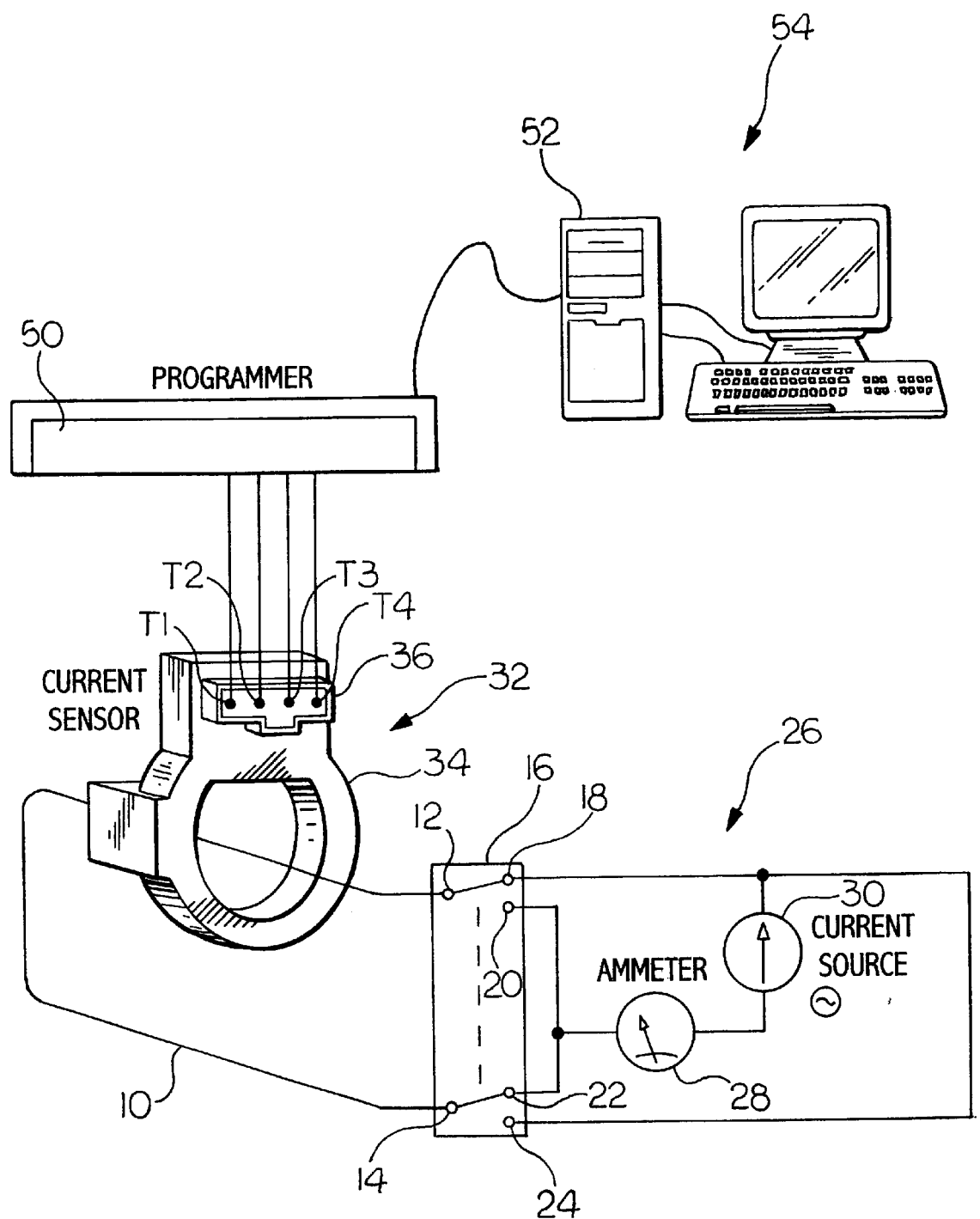
FIG. 1 is a schematic view of a current sensing apparatus in accordance with the present invention.

There is shown in FIG. 1 an electrical current flow path 10 for which it is desired to sense the parameters of the current flowing along the path. The path 10 is representative of any circuit configuration such as an electronic module to be tested for proper operation after assembly or a winding of an electric motor to be monitored for current flow. Opposite ends of the path 10 are releasably connected to a pair of switch terminals 12 and 14 of a double pole double throw (DPDT) switch 16. The first terminal 12 is associated with a first pole of the switch 16 and can be switched between a first contact 18 and a second contact 20. The second terminal 14 is associated with a second pole of the switch 16 and can be switched between a third contact 22 and a fourth contact 24. As shown, the poles are switched simultaneously so that, for example, when the terminal 12 is connected to the contact 18, the terminal 14 is connected to the contact 22.

The DPDT switch 16 is included in a test and calibration circuit 26 having an ammeter 28 and a current source 30 connected in series. The second contact 20 and the third contact 22 are connected to one terminal of the ammeter 28 having another terminal connected to a terminal of the current source 30. Another terminal of the current source 30 is connected to the first terminal 18 and the fourth terminal 24. The current source 30 can generate AC or DC current as required for testing and calibrating the current sensor described below. In the position of the switch 16 shown in FIG. 1, the first terminal 12 is connected to the current source 30 and the second terminal 14 is connected to the ammeter. Switching the switch 16 reverses the connections of the power supply 26 to the current flow path 10. Thus, the polarity of DC current supplied to the current path 10 can be reversed.

Figure 2:
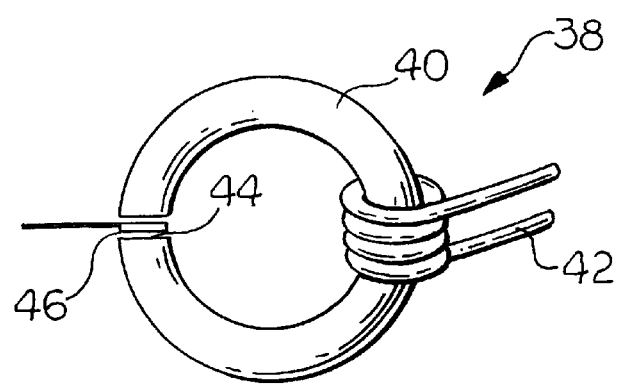
FIG. 2 is a schematic view of a current sensor pickup used in the apparatus shown in FIG. 1.

Current flowing in the path 10 is sensed by an electric current sensor 32 according to the present invention. The sensor 32 includes an annular housing 34 having a terminal block 36 mounted on an exterior surface thereof. The housing 34 is formed of a suitable material, such as a molded plastic material, and encloses an inductive pickup 38 shown in FIG. 2. The pickup 38 includes a slotted (ferric or soft magnetic) ferrite core 40 extending through a pickup winding 42. Positioned in a slot 44 of the core 40 is a programmable linear Hall Effect sensor integrated circuit 46, for example, a MLX90237 chip manufactured by Melexis and available in the United States from Dominion Group of Fishers, IN. This IC utilizes a single chip and is digitally programmable through its electrical leads that are connected to the terminal block 36.

Figure 3:
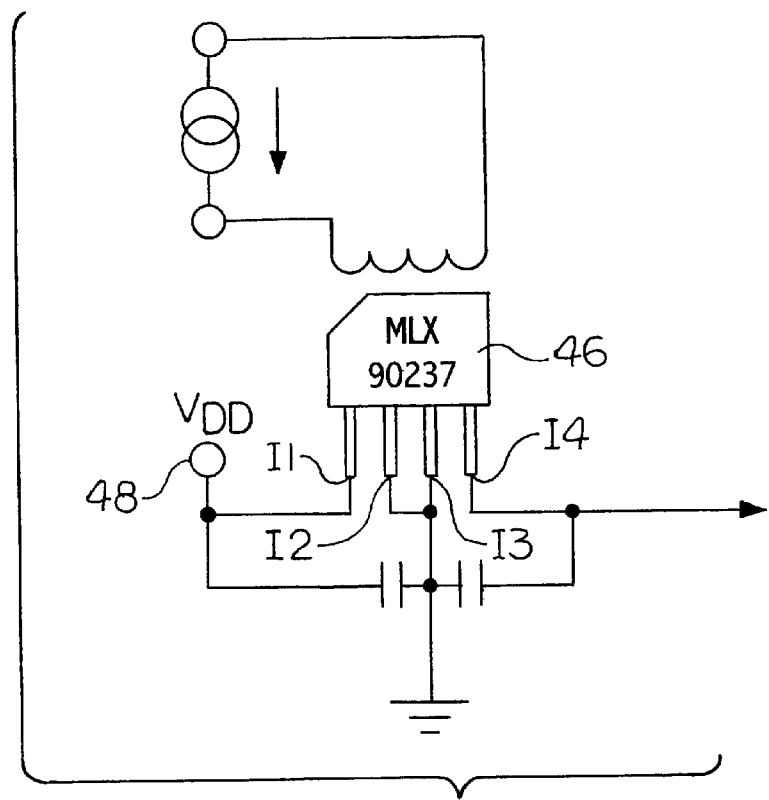
FIG. 3 is a circuit schematic of the programmable integrated circuit shown in FIG. 3.

A schematic circuit diagram of the connections of the IC 46 is shown in FIG. 3. A supply voltage pin I1 is connected to a positive potential terminal of a supply voltage source 48. A variable voltage supply is used to control the operation of the IC 46 as explained below. A pin I2 is a test pin for readback diagnostic use only. A pin I3 is connected to the circuit ground potential. An output pin I4 is used for a sensed current output signal of the IC and can be changed to an input.

The electric current sensor 38 is an inductive pickup (non-invasive) device. A wire (current path 10 in FIG. 1 and wire 42 in FIG. 2) carrying the current to be measured is passed through the center of the C-shaped steel toroid 40. Inserted into the flux gap 44 of the split toroid 40 is the digitally programmable Hall Effect IC 46. Following the completed assembly of the current sensor 32 (FIG. 1), with the pins of the IC 46 accessible at the terminal block 36, the output offset, gain and temperature compensation of the IC 46 can be adjusted and set. The pin I1 is connected to a terminal T1, the pins I2 and I3 are connected to a pair of terminals T2 and T4, and the pin I4 is connected to the terminal T3.

A programming technique allows the normally analog signal measurement output pin I4 connected to the terminal T3 to be utilized as a digital serial data input to the IC 46. For example, when the supply voltage at the terminal T1 is in the range of 4.5 V to 5.5 V, the output at the terminal T3 behaves normally. When the supply voltage is raised to 13 V, the pin I4 connected to the terminal T3 functions as an input allowing a 31-bit word programming signal to be clocked in. All data is loaded through a single line in a load sequence with no dedicated clock signal. The clock and data are integrated into one programming signal that is initiated with the beginning of the load sequence and clocked with the positive edge of each bit. No extra auxiliary programming interface pins are required. Also avoided is the expense of potentiometer adjustment or resistor laser trimming. Part-to-part variability is improved and cost is reduced.

There is shown in FIG. 1 a programmer 50 manufactured by Melexis as a model PTC-01 for programming the IC 46. Programming ports of the programmer 50 are connected to the terminals T1 through T3 on the terminal block 36. An RS232 serial interface port is connected with a processor 52 of a personal computer 54. The computer 54 runs standard windows based Melexis software for programming the IC 46. The software and the programmer 50 permit the user to load magnetic response function settings, take measurements, and calibrate the sensor 32. Using the test and calibration circuit 26, the sensor 32 can be programmed to operate with a wide variety of current flow paths 10. For example, a separate one of the sensors 32 can be associated with each current flow path of a polyphase electric motor to generate feedback signals to a controller. Each of the sensors 32 can be calibrated to the associated current flow path after installation. The sensor 32 can be used with different size electric motors by programming the current range to be sensed.

The slotted core 40 is generally circular in cross section and is held in place in the plastic housing 34 by an integrally molded tab (not shown) extending into the slot 44. The tab is smaller than the slot 44 yet larger than the width of the Hall IC 46. This serves to align the core 40 as it constrains rotation of the core and enables the use of the circular cross section core instead of the more traditional rectangular core. A circular cross section core is less costly to manufacture than a rectangular core. Also, there is a more uniform field density in a circular toroidal core, an attribute that improves performance and reduces the amount of material needed for the core.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An apparatus for sensing electrical current flowing in a conductor comprising:

a toroidal core formed of a ferric material and having a slot extending through said core defining an air gap, said core having a central aperture;

an electrical current carrying conductor received in said central aperture, said core concentrating in said air gap magnetic flux generated by electrical current flowing in said conductor;

a power supply connected to said conductor for generating a known electrical current in said conductor;

a Hall Effect sensor integrated circuit positioned in said air gap and having a power supply pin and an output pin; and a programming means connected to said power supply pin and said output pin, whereby said integrated circuit responds to an application of a first signal applied at said power supply pin by said programming means by generating at said output pin an output signal representing an amount of the known current flowing in the conductor and said integrated circuit responds to a second signal applied at said power supply pin by accepting a programming signal applied at said output pin and calibrating said output signal in response to said programming signal.

2. The apparatus according to claim 1 including a switch connected between said conductor and said power supply for reversing a polarity of said power supply.

3. The apparatus according to claim 1 wherein said programming means includes a programmer connected to said pins for generating said first signal, said second signal and said programming signal.

4. The apparatus according to claim 3 wherein said programming means includes a programmed computer connected to said programmer for generating data included in said programming signal.

5. The apparatus according to claim 1 wherein said programming means generates said first signal at a first voltage magnitude and said second signal at a second voltage magnitude higher than said first voltage magnitude.

6. An apparatus for sensing electrical current flowing in a conductor comprising:

a toroidal core formed of a ferric material and having a slot extending through said core defining an air gap, said core having a central aperture whereby when an electrical current carrying conductor is received in said central aperture, said core concentrates in said air gap magnetic flux generated by the current flowing in the conductor;

a Hall Effect sensor integrated circuit positioned in said air gap and having a power supply pin and an output pin;

a housing enclosing said core and said integrated circuit, said housing having a central aperture aligned with said core central aperture; and a terminal block mounted on said housing and having a first terminal connected to said power supply pin and a second terminal connected to said output pin, whereby said integrated circuit responds to an application of a first signal applied at said first terminal by generating at said second terminal an output signal representing an amount of the current flowing in the conductor and said integrated circuit responds to a second signal applied at said first terminal by accepting a programming signal applied at said second terminal and setting magnetic response functions in response to said programming signal.

7. The apparatus according to claim 6 wherein said programming signal includes data for setting at least one of output offset, gain and temperature compensation.

8. The apparatus according to claim 6 wherein said programming signal includes data for setting a current sensing range.

9. The apparatus according to claim 6 including a programmer connected to said first and second terminals for generating said first signal, said second signal and said programming signal.

10. The apparatus according to claim 9 including a programmed computer connected to said programmer for generating data included in said programming signal.

11. The apparatus according to claim 9 wherein said programmer generates said first signal at a first voltage magnitude and said second signal at a second voltage magnitude higher than said first voltage magnitude.

12. The apparatus according to claim 6 wherein said housing is formed of a plastic material.

* * * * *